(12) United States Patent
Zhu et al.

(10) Patent No.: US 8,306,802 B2
(45) Date of Patent: Nov. 6, 2012

(54) METHOD FOR MODELING AN HDL DESIGN USING SYMBOLIC SIMULATION

(75) Inventors: Yunshan Zhu, Cupertino, CA (US);
James Herbert Kukula, Hillsboro, OR (US); Robert F. Damiano, Lake Oswego, OR (US); Joseph T. Buck, Campbell, CA (US)

(73) Assignee: Synopsys, Inc., Mountain View, CA (US)

( * ) Notice: Subject to any disclaimer, the term of this patent is extended or adjusted under 35 U.S.C. 154(b) by 770 days.

(21) Appl. No.: 11/556,050

(22) Filed: Nov. 2, 2006

(65) Prior Publication Data

US 2008/0126066 A1    May 29, 2008

(51) Int. Cl.
   *G06F 17/50*    (2006.01)
(52) U.S. Cl. ............. 703/14; 703/13; 703/15; 703/16; 703/17; 716/103; 716/104; 716/106; 714/33; 714/39; 714/738
(58) Field of Classification Search .............. 703/14, 703/13, 16; 716/5, 18, 4, 3, 6, 103, 106, 716/104; 714/33, 39, 738
   See application file for complete search history.

(56) References Cited

U.S. PATENT DOCUMENTS

| 5,491,639 | A * | 2/1996 | Filkorn ............................. 716/5 |
| 7,454,324 | B1 * | 11/2008 | Seawright et al. ............. 703/14 |
| 2005/0091025 | A1 | 4/2005 | Wilson et al. |
| 2005/0138586 | A1 | 6/2005 | Hoppe et al. |
| 2006/0085774 | A1 | 4/2006 | Moorby |

OTHER PUBLICATIONS

Jeffrey Su, David L. Dill, Clark W. Barrett Automatic Generation of Invariants in Processor Verification Lecture Notes in Computer Science, Springer Berlin/Heifelberg, 1996, vol. 116/1996, pp. 377-388.*
Rajeev Kumar Ranjan Design and Implementation Verification of Finite State Systems Graduation Division of the University of California, Berkley, Fall 1997.*
Annette Bunker, Ganesh Gopalakrishnan, Sally A. McKee Formal Hardware Specification Languages for Protocol Compliance Verification ACM, 2004, 108404309/04/0100 ACM Transactions on Deisng Automation of Electronic Systems, Vo. 9, No. 1, Jan. 2004, pp. 1-32.*
Palnitkar Verilog HDL A Guide to Digital Design and Synthesis, pp. 124-130 SunSoft Press A Prentice Hall Title, 1996 Sun Microsystems.*
Gary York, Samir Jain, Derek Beatty, Manish Pandey, Alok Jain, Randal Bryant Extraction of Finite State Machines from Transistor Netlists by Symbolic Simulation IEEE 1995, 1063-6404/95, pp. 596-601.*
Diana Toma, Dominique Borrione, and Ghiath Al Sammane Combining Several Paradigms for Circuit Validation and Verification CASSIS 2004, LNCS 3362, pp. 229-249, 2005.*
Alfred Kolbl et al. "Symbolic RTL Simulation" Proc. 38th Conference on Design Automation, 2001, pp. 47-52.

* cited by examiner

*Primary Examiner* — Saif Alhija
*Assistant Examiner* — Cuong Luu
(74) *Attorney, Agent, or Firm* — Kenta Suzue; Haynes Beffel & Wolfeld LLP

(57) ABSTRACT

A method for digital circuit design. The first step of the process is the step of providing a circuit design in the form of a hardware definition language. Then, the process produces a binary simulation of the design by setting out for each unit of time during execution of the hardware design the a control state and a program state of the design and assigns a symbol to each signal of the design. The process proceeds by executing a symbolic simulation of the design, concluding with identifying and capturing the combinational logic expression of the simulation output and the next state functions of the simulation.

48 Claims, 2 Drawing Sheets

METHOD FOR MODELING AN HDL DESIGN USING SYMBOLIC SIMULATION

BACKGROUND OF THE INVENTION

Design of modern digital circuits is accomplished with electronic design automation (EDA) tools, capable of dealing with component arrays that total millions of gates. Such systems are well beyond the capacity of human designers. Generally, an EDA tool must be able to accept as input a functional description of a given circuit, and it must produce as output a concrete circuit design. The art has largely relied on hardware design languages (HDLs) to perform automated electronic design functions. Languages such as Verilog or VHDL can express designs either at gate level or at Register Transfer Level (RTL). After the design is rendered in RTL, the design is translated into a combinational netlist, which can serve as a blueprint for rendering the circuit in silicon.

A major issue, however, is the need to validate such a circuit. Not only must the designer be confident of the ability of the circuit to operate without electronic, timing or interconnection issues, but the designer must also verify that the circuit performs the logical operations specified. The most common approach to such verification is to simulate the actual circuit operation. Simulation routines commonly employed in the art are discrete operations—inputs are presented, the circuit response is simulated, and outputs are determined. Such simulation here is referred to as "concrete", as the simulation consists of providing concrete signal values—1's and 0's—to the device under test (DUT), and then collecting the responses.

The primary weakness of concrete simulation is the necessity for a designer to construct the simulation routines. Nothing can be tested under such a system unless the appropriate inputs are determined and presented to the DUT. That is, the designer must anticipate how to conduct the test—exactly what test, how to test it, and the inputs required. Given the complexity of a modern digital circuit, no system could run all possible inputs, and no designer could list them. Thus, the completeness of the test depends on the skill of the test designer, not the capability of the test system.

In addition, concrete simulation tests one cycle of DUT operation for each cycle of simulation. Of course, simulation of a complex circuit proceeds at a relatively slow pace, given the need to determine and record operations across a circuit. Actual rates of 1 hz are not uncommon. Given that the DUT will generally be designed to operate in the gigahertz range, the physical impossibility of performing exhaustive and complete concrete testing is clear.

Model checking provides the exhaustive verification not possible with concrete methods. Such model checking requires gate-level netlists, however, and systems available in the art for performing such translation are generally limited in the range of HDL RTL language constructs that can be represented. Moreover, they do not fully preserve the behavior and semantics of the HDL RTL after translation. Those issues are addressed in the system set out below.

SUMMARY OF THE INVENTION

A method for digital circuit design. The first step of the process is the step of providing a circuit design in the form of a hardware definition language. Then, the process produces a binary simulation of the design by setting out for each unit of time during execution of the hardware design a control state and a program state of the design and assigns a symbol to each signal of the design. The process proceeds by executing a symbolic simulation of the design, concluding with identifying and capturing the combinational logic expression of the simulation output and the next state functions of the simulation.

DETAILED DESCRIPTION

Figure 1:
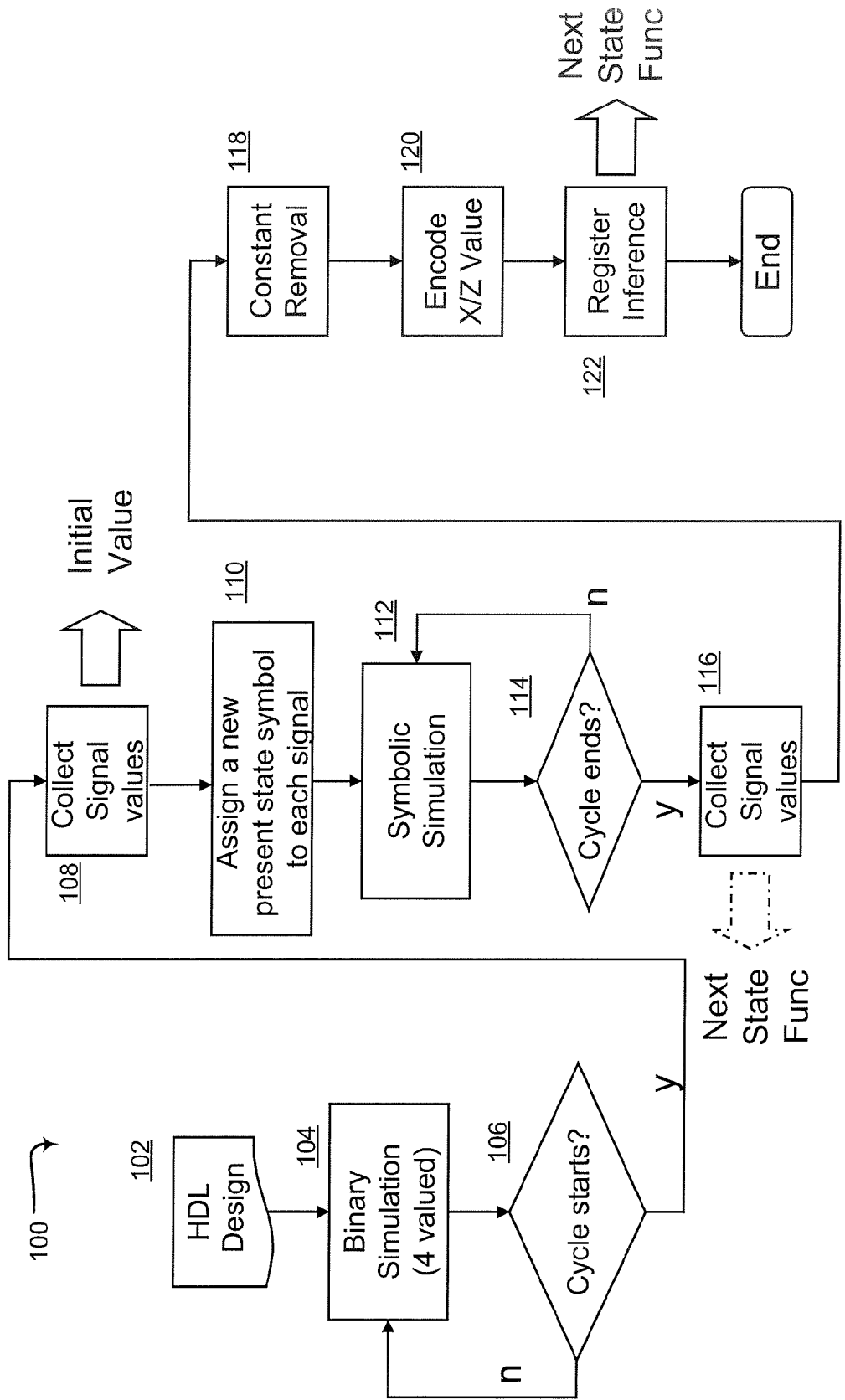
FIG. 1 illustrates a flow chart for an embodiment of a method described herein.

The following detailed description is made with reference to the figures. Preferred embodiments are described to illustrate the present invention, not to limit its scope, which is defined by the claims. Those of ordinary skill in the art will recognize a variety of equivalent variations on the description that follows.

An exemplary embodiment sets out the symbolic simulation off the Verilog design shown in Table 1, below. As seen, that design describes a 4-bit counter s, having an output signal par, which depends of the value of input signal even, computes whether the parity of the count is odd or even. Two threads are set out, one of which performs the count and the other computes the parity bit.

TABLE 1

Counter with parity bit

| | |
|---|---|
| D1: | module dut(clk, rst, even, par); |
| D2: | input clk, rst, even; output par; |
| D3: | reg [3:0] s; reg par; |
| D4: | |
| D5: | always @(posedge clk or posedge rst) |
| D6: |   if (rst) s <= #1 4'b0; |
| D7: |   else    s <= #1 s + 1; |
| D8: | |
| D9: | always @(s or even) begin |
| D10: |   #5; |
| D11: |   par = even & ^s; |
| D12: | end |
| D13: | endmodule |

The listing of Table 1 is RTL Verilog, which employs event control mechanisms, such as non-blocking assignments and delays, to describe the behavior of the circuit. The resulting description essentially communicates to an event-driven simulator exactly how to reproduce that behavior. In the first always block, for example, the listing sets out a condition for execution (posedge elk or posedge rst) and follows with an if . . . then . . . else segment that specifies the action to be taken. Clearly, these instructions can be implemented in hardware, in a set of gates, or in software, as in a simulator that exercises the circuit.

Simulation in the Verilog environment occurs in a testbench module such as that shown in Table 2, below.

TABLE 2

Testbench

| | |
|---|---|
| T1: | module tb; |
| T2: | initial begin |
| T3: |   dut.clk = 0; dut.rst = 1; |
| T4: |   forever begin |
| T5: |     #10 $sample( ); |
| T6: |       dut.clk = 1; dut.rst = 0; |
| T7: |     #10 $nondet(dut.even); |

TABLE 2-continued

| | Testbench |
|---|---|
| T8: | dut.clk = 0; |
| T9: | end |
| T10: | end |
| T11: | endmodule; |

The testbench, as is generally true in Verilog systems, operates to test and exercise the design under test (DUT). The structure of the testbench sets out in concrete form the designers assumptions about timing relationships among the clock, reset and input signals, as well as any sampling operations. As shown, the reset signal, rst, is asserted at time 0 and then kept inactive for the remainder of the simulation. Registers update at the positive edges of the clock, and inputs change at the negative clock edges. Sampling of signals occurs just before the positive clock edges.

It should be noted that sampling is accomplished by a system call, $sample( ). That function collects initial values of each signal and assigns fresh symbols to them, and the second call collects the next state value of each signal and generates a formal model. The call to $nondet assigns a fresh value to the variable, in this instance, dut.even.

In the example shown, the designer would have little trouble structuring inputs to the testbench to ensure a thorough simulation of the counter circuit. It can be readily appreciated, however, that a Verilog listing for a complete ASIC would present a problem of an entirely different order. There, the task of adequately structuring a test that is both thorough and feasible can be similarly appreciated as presenting a practical impossibility. The art has sought to devise a solution to this difficulty, generally through processes involving simulation of one sort or another. The simulations employed in the art, however, have attempted to generalize the concrete problem by generalizing values. That is, concrete values, such as 1's and 0's, are replaced by symbolic values that can then be incorporated into expressions that set out relationships in the DUT.

Such simulations are useful, but they do not solve the problem described above, presented by the need to adapted a 1 hz simulation process to a multi-gigahertz device. The approach set out below solves that difficulty by generalizing the execution time itself. To describe briefly, it has been noted that the "control state" of a simulation—the collection of program counter entry points waiting on the event queue—revisits a common "home" state every execution cycle. That fact allows the definition of an arbitrary cycle, starting at the "home" state, continuing with the execution of a series of set events, and returning to the "home" state.

The following description sets out an embodiment of a simulator that implements a fully symbolic approach, generalizing both the signal values and the execution time. It will be understood that the embodiment is purely exemplary and not limiting in nature.

The state of the simulation at the end of each time unit is shown in Table 3, below. A simulation state consists of two components: a control state and a program state. The control state models the state of execution of the simulation, as set out in the program counters and pending variable updates. A Verilog design typically includes multiple concurrent processes, and the communication and scheduling of processes are specified with time delay and event control statements. Upon execution, these statements can suspend a process and register a wake-up condition with the simulator. For a sequential program, the program counter can be modeled as a line number or statement index. In the embodiment shown, the program counter is modeled as a pair, <trigger, statement>. The trigger condition can be a time delay such as #5, #0 or a non-blocking delta delay; or it can be an event such as @(clk); or it can also be null, indicating that the statement does not require a trigger condition. Table 3 includes a number of time delay statements (such as seen at time 1, and a non-blocking assignment at time 0.

It should be noted that the time delay expressions in Table 3 (e.g., #1, #5, etc.) are relative, not absolute time references, to promote simplicity. Thus, at time 1 a pending event D10 is scheduled to occur in 5 time units. At time 2, the same event appears again, now 4 units in the future, and so on. This use of relative time allows one to note that the pending event at time 1 is identical to that shown at time 11. Further, this use of relative time removes any requirement to track global simulation time as an element of the simulation state.

TABLE 3

Simulation States

| Time | control state | | | | (s | program state | |
|---|---|---|---|---|---|---|---|
| | | | | | | \| even | \| par |
| 0 | <#1 NBA,D6> | D5 | D9 | T5 | x | \| x | \| x |
| 1 | <#5, D10> | D5 | | T5 | x | \| x | \| x |
| 2 | <#4, D10> | D5 | | T5 | x | \| x | \| x |
| 6 | | D5 | D9 | T5 | 0 | \| x | \| 1 |
| | | | | | | | <--- Sample |
| 10 | <#1 NBA,D7> | D5 | D9 | T7 | s0 | \| e0 | \| p0 |
| 11 | <#5,D10> | D5 | | T7 | s0+1 | \| e0 | \| p0 |
| 16 | | D5 | D9 | T7 | s0+1 | \| e0 | \| e0 & ^(s0+1) |
| 20 | | D5 | D9 | T5 | s0+1 | \| e1 | \| e1 & ^(s0+1) |
| | | | | | | | <--- Sample |
| 30 | | | | | | | |

The program counters are shown as the right-hand columns of the control state portion of the table. Simple designs only require a single program counter for each process, but at least two scenarios exist in which a process can have multiple entry points. The first situation involves non-blocking assignments, which cause the simulator to continue executing subsequent statements and to submit the assignment into a non-blocking event queue. The control state is extended to include all pending non-blocking assignments.

The second situation in which multiple entry points can occur is caused by symbolic simulation itself. This point is clarified by consideration of Tables 4 and 5, below.

TABLE 4

Multiple Entry Points

| | |
|---|---|
| L0: | always |
| L1: | if (a) |
| L2: | #2 b = ~b; |
| L3: | else |
| L4: | #3 c = ~c; |

If this design is subjected to a concrete simulation, the process is suspended either at statement L2 or L4, based on the evaluation of a. A symbolic simulation, however, executes both branches of the if statement, creating two events with complementary control conditions. The case can be handled by normalizing the source code to remove time delay or event control in branching statements, as seen in Table 5.

TABLE 5

Multiple Entry Points

```
// transformed source
// for simplicity, assume t1 and t2 are initialized to 0
L0: always            always              always
L1:   if (a)            ① t1                ① t2
L2:     t1 = ~t1;       #2 b = ~b;          #3 c = ~c;
L3:   else
L4:     t2 = ~t2;
```

Alternatively, another embodiment solves this problem by allowing multiple program counters in a process. That method requires enabling conditions for each such program counter, to introduce fresh signals into the program state.

The program state tracks the state of each variable in the simulation. As seen in Table 3, the program state there maintains values for variables s. even and par at each time of the simulation.

A difficulty often encountered in the prior art has been capturing state transitions at fine levels of granularity. Transitions are defined generally as the update of simulation state due to the execution of a single statement. The resulting model must therefore define transitions of the program state as well as the control state, which turns out to be a complex task, involving multiple event queues to hand active, inactive, non-blocking and future events. The size of the event queues make such model checking infeasible, even for small Verilog designs.

It has been found that operating at fine levels of granularity is not required, however. Capturing the simulation state at certain strobe points has been found to provide completely sufficient information, allowing the designer to disregard combinational glitches that might occur during the simulation. The embodiments show here all define the boundaries of a logical cycle as synchronization points, and data is captured at each such point. The only requirement is that the two synchronizations points must have identical control states.

Computation of a control state involves symbolic simulation. At the beginning of a logical cycle, a distinct symbolic value is assigned to each signal in the symbol table. The symbolic simulation is then run, and at the end of the logical cycle the assignment of table entries is collected. Analysis of changes leads directly to the transition function, as will be clear to those in the art.

Referring back to Table 3, it can be noted that at time 10, before posedge clk occurs, the system samples the program state and assigns fresh symbols to each signal in the design. Prior to that point, symbolic simulation is identical to concrete simulation, as no symbolic values have been introduced. At time 20, before negedge clk, new symbolic value e1 is injected as the input. At time 30, before posedge clk, the second strobe occurs, providing a second sample of the program state. This second strobe of the program state provides the translation relation of the device under test. Moreover, the control states of the simulation 1 at the two strobe points are identical (D5, D9, T5). Thus, the program state by itself completely captures the transition of the simulation.

To employ the program state as a formal model, the simulation state must be sampled at appropriate points, referred to a synchronization points. The set of synchronization points must fulfill two conditions: First, all synchronization points must have a common control state. Second, the set of synchronization points is closed—that is, a simulation run from one synchronization point to another must be possible in a finite number of steps.

Defining two simulation states as equivalent if they have the same control state signifies that a synchronization set is an equivalence class induced by the equivalence relation. Not all equivalence classes satisfy the second condition above, however. For example, if one considers the control state <#1, NBA, D6> seen at time 0 of Table 3, it can be seen that this state is reached only during a reset sequence and thus cannot be a synchronization point.

For synthesizable Verilog designs, simulation states immediately preceding a clock edge are valid synchronization points. Setup time constraints require signal values to remain stable before the clock edge in order to ensure that proper values are registered. Once the synchronization set is selected, one can compute the state transitions between adjacent synchronization points, or a transition that spans a number of such points.

The symbolic simulation itself is set out in Table 6, below. As seen, the symbol table maintains a control variable for each thread of execution, representing the condition under which the current statement can be reached. In the example shown, the control condition before the if state is 1. For the then branch of the if statement, the control condition is e0, where e0 is the symbolic value for variable en. Under that condition, s is represented by the expression (e0? 1: s0) after the assignment. If e0 is 0, then s takes the old value of s0; otherwise, s=1. Execution of the else branch is similar.

TABLE 6

Symbolic simulation

| Verilog | Control condition | Symbol Table (en | \| s | \| t) |
|---|---|---|---|---|
| | 1 | e0 | \| s0 | \| t0 |
| if (en) | | | | |
| | e0 | e0 | \| s0 | \| t0 |
| s = 1; | e0 | e0 | \| e0 ? 1 : s0 | \| t0 |
| else | | | | |
| | ~e0 | e0 | \| e0 ? 1 : s0 | \| t0 |
| t = s; | ~e0 | e0 | \| e0 ? 1 : s0 | \| e0 ? s0 : t0 |
| | 1 | e0 | \| e0 ? 1 : s0 | \| e0 ? s0 : t0 |

Figure 2:
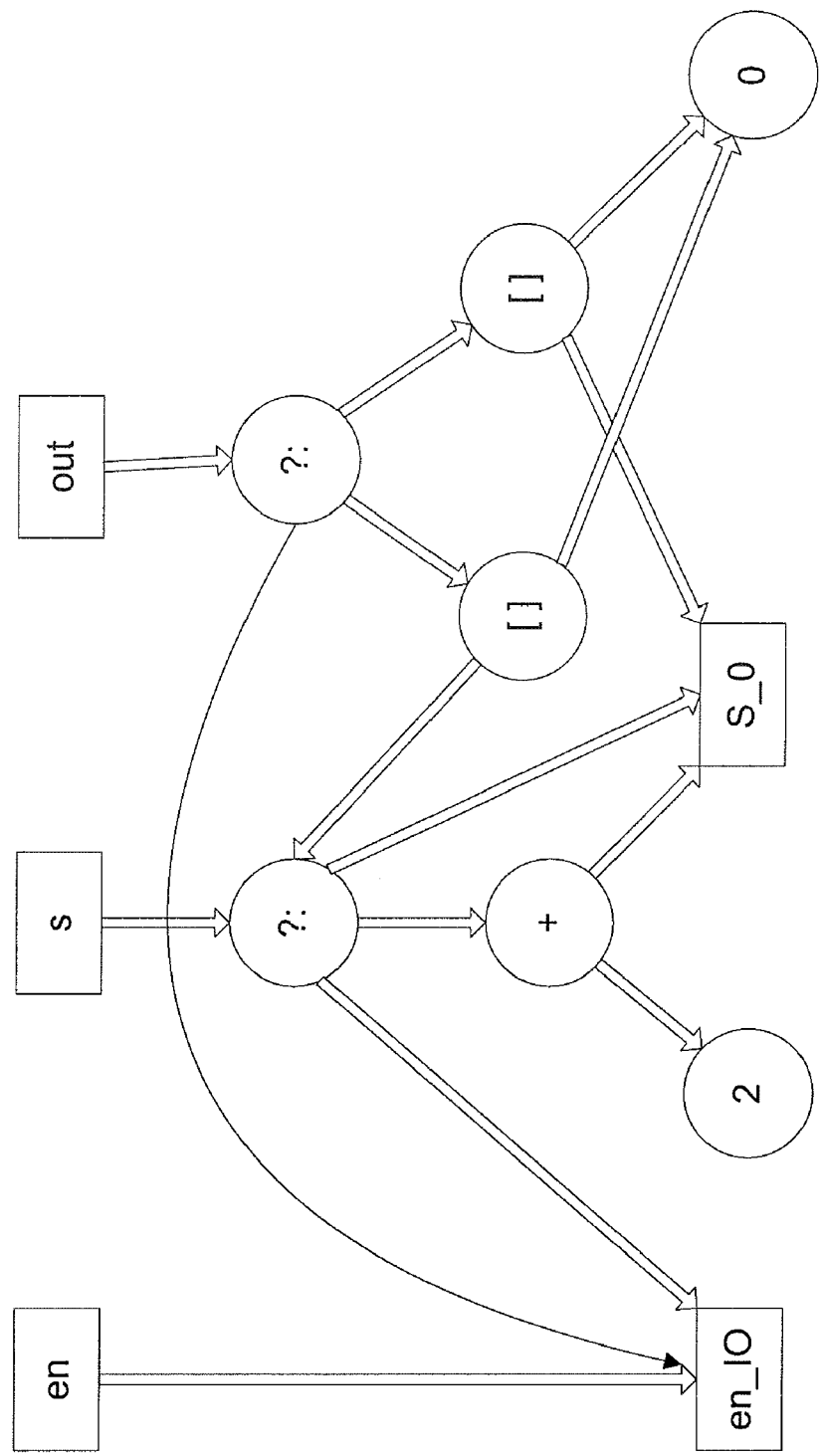
FIG. 2 depicts a non-canonical word-level expression according to the embodiment of FIG. 1.

Unlike attempts to employ symbolic simulation in the prior art, the embodiment shown here utilizes non-canonical word-level expressions to represent signal values. As seen in FIG. 2, which represents a two-bit counter, such expressions take the form of reference-counted trees, with one node type per Veriolg operator, with additional operators added as required. Thus, the program state takes the form of a directed acyclic graph (DAG).

It is important to note that the Verilog sequence shown in the left-hand column of Table 6 carries out a concrete simulation. That is, signals are assigned a concrete x or z value, and the simulator exercises the system in as many variations as the designer can anticipate. Also, reset operations are used to reach an initial state of the design. In contrast, the symbolic simulation of the embodiment shown starts from a symbolic state where each signal has a distinct symbolic value. This state represents an over-approximation of all reachable states, and in fact it is likely to include some unreachable states as well. Such conditions can introduce combinational loops in the design, which can be handled by limiting the number of times a given process can trigger.

The detailed steps set out above can be incorporated into an overall process such as the embodiment 100 shown in FIG. 1. There, the process starts with the production of an HDL design in step 102, such as the module and testbench of Tables 1 and 2. Then, a binary simulation of the design is prepared (steps 104, 106), as is known in the art, to produce the program state and control state of Table 3. At this point the signal values can be collected (step 108) and a fresh symbol assigned to each signal (step 110). The symbolic simulation is then performed (steps 112, 114) and the signal values collected (step 116).

The resulting simulation can be optimized, as shown in steps 118, 120 and 122. First, constants are removed (step 118). Then an encoding algorithm is applied to produce an efficient variable encoding. The issue here is that Verilog employs a four-state variable structure, as is known, in which variable assume values 0, 1, x, or z. In order to interface the system to other modules, however, the only way to replicate this structure fully would be to employ two Boolean variable for each Verilog variable, which doubles the number of state bits required, seriously impacting efficiency. For example, a known "fixpoint" algorithm takes advantage of the fact that Verilog arithmetic operators are restricted to two values (0 or 1), not four. It is known to employ such properties to define variable classes that permit Boolean representation of each variable. Other algorithms are available to and known in the art.

Overall operation of the embodiment is best seen in Table 3. Several key points can be observed from that table. First, as noted above, the arbitrary single cycle over which the circuit is analyzed can be seen in the period between sample points, starting at T10 and ending at T20. Thus, the cycle commences with the assignment of fresh symbolic variables to the signals. Here, the variable s, even and par, previously represented by concrete values, are assigned symbolic values s0, e0 and p0. Further, an examination of the program state at T20 reveals that only one of the original variables is still present—s0. That variable is therefore the only candidate to serve as a state variable during execution of the process.

Two expressions are captured here. First are the outputs of the simulation, combinational logic expressions, which can be rendered as a physical circuit. In Table 3, the output is par, represented by the expression e1 & ^(s0+1). That expression can readily be rendered in silicon as a combinational logic circuit. Second are the expressions associated with state variables, such as the expression s0+1, associated with state variable s in Table 3. The expression s0+1 is here the next state function for s, and it is an essential component of the netlist to be generated. Taken together these two classes of expressions define a classical Mealy machine, whose key components are the output functions and next state functions.

In practical application, of course, the circuits to be analyzed are considerably more complex than the listing of Table 1. The principles set out here, however, can be applied nonetheless to provide combinational logic expressions that not only can be rendered into physical circuits, but designers can have confidence that such circuits are the result of rigorous mathematical analysis.

The symbolic simulation process set out herein can be embodied in a number of environments and formats. For example, the system is susceptible to implementation in a variety of formats, in varying combinations of software modules, written in a variety of languages. Such constructional details do not affect the principles employed, which are governed solely by the claims appended hereto. It is contemplated that modifications and combinations will readily occur to those skilled in the art, which modifications and combinations will be within the spirit of the invention and the scope of the following claims.

We claim as follows:

1. A method for digital circuit design, comprising the steps of:
    providing a circuit design in the form of a hardware description language;
    performing a simulation of the circuit design by setting out, for multiple points of time during execution of the circuit design, a control state of the circuit design and a program state of the circuit design, wherein the control state includes program counters and pending variable updates, including:
        assigning a symbol to each signal of the circuit design; and
        executing a symbolic simulation of the circuit design including at least one non-unrollable loop;
    based on the simulation of the circuit design in the form of the hardware description language, identifying and capturing at synchronization points where contents of the control state are identical:
        a combinational logic expression of the simulation output; and
        next state functions of the simulation; and
    based on said identifying and capturing, generating a formal model of the circuit design, wherein the simulation of the circuit design identifies the synchronization points in time based on having identical contents of at least one variable of the control state.

2. The method of claim 1, wherein the formal model defines a Mealy machine.

3. The method of claim 1, wherein the circuit design is set out in Verilog.

4. The method of claim 1, wherein the circuit design is set out in VHDL.

5. The method of claim 1, wherein the set of synchronization points is closed such that a simulation run between different points of the set of synchronization points occurs in a finite number of steps.

6. A method for digital circuit design, comprising the steps of:
    providing a circuit design in the form of a hardware description language;
    performing a simulation of the circuit design by setting out, for multiple points of time during execution of the circuit design, a control state of the circuit design and a program state of the circuit design, wherein the control state includes program counters and pending variable updates, including:
        assigning a symbol to each signal of the circuit design; and
        executing a symbolic simulation of the circuit design including at least one time delay;
    based on the simulation of the circuit design in the form of the hardware description language, identifying and capturing at synchronization points where contents of the control state are identical:
        a combinational logic expression of the simulation output; and
        next state functions of the simulation; and
    based on said identifying and capturing, generating a formal model of the circuit design,
    wherein the simulation of the circuit design identifies the synchronization points in time based on having identical contents of at least one variable of the control state.

7. The method of claim 6, wherein the formal model defines a Mealy machine.

8. The method of claim 6, wherein the circuit design is set out in Verilog.

9. The method of claim 6, wherein the circuit design is set out in VHDL.

10. The method of claim 6, wherein the set of synchronization points is closed such that a simulation run between different points of the set of synchronization points occurs in a finite number of steps.

11. The method of claim 1, wherein the simulation of the circuit design captures simulation state at synchronization points having identical contents of all variables of the control state, and fails to capture simulation state at other points.

12. The method of claim 6, wherein the simulation of the circuit design captures simulation state at synchronization points having identical contents of all variables of the control state, and fails to capture simulation state at other points.

13. The method of claim 6, further comprising:
computing state transitions between a number of the synchronization points.

14. The method of claim 1, further comprising:
computing state transitions between a number of the synchronization points.

15. The method of claim 1, wherein the simulation of the circuit design captures simulation state at synchronization points having identical contents of all variables of the control state.

16. The method of claim 6, wherein the simulation of the circuit design captures simulation state at synchronization points having identical contents of all variables of the control state.

17. An apparatus configured as an electronic design automation tool, comprising:
computing hardware configured to execute:
providing a circuit design in the form of a hardware description language;
performing a simulation of the circuit design by setting out, for multiple points of time during execution of the circuit design, a control state of the circuit design and a program state of the circuit design, wherein the control state includes program counters and pending variable updates, including:
assigning a symbol to each signal of the circuit design; and
executing a symbolic simulation of the circuit design including at least one non-unrollable loop;
based on the simulation of the circuit design in the form of the hardware description language, identifying and capturing at synchronization points where contents of the control state are identical:
a combinational logic expression of the simulation output; and
next state functions of the simulation; and
based on said identifying and capturing, generating a formal model of the circuit design,
wherein the simulation of the circuit design identifies the synchronization points in time based on having identical contents of at least one variable of the control state.

18. The apparatus of claim 17, wherein the formal model defines a Mealy machine.

19. The apparatus of claim 17, wherein the circuit design is set out in Verilog.

20. The apparatus of claim 17, wherein the circuit design is set out in VHDL.

21. The apparatus of claim 17, wherein the set of synchronization points is closed such that a simulation run between different points of the set of synchronization points occurs in a finite number of steps.

22. An apparatus configured as an electronic design automation tool, comprising:
computing hardware configured to execute:
providing a circuit design in the form of a hardware description language;
performing a simulation of the circuit design by setting out, for multiple points of time during execution of the circuit design, a control state of the circuit design and a program state of the circuit design, wherein the control state includes program counters and pending variable updates, including:
assigning a symbol to each signal of the circuit design; and
executing a symbolic simulation of the circuit design including at least one time delay;
based on the simulation of the circuit design in the form of the hardware description language, identifying and capturing at synchronization points where contents of the control state are identical:
a combinational logic expression of the simulation output; and
next state functions of the simulation; and
based on said identifying and capturing, generating a formal model of the circuit design,
wherein the simulation of the circuit design identifies the synchronization points in time based on having identical contents of at least one variable of the control state.

23. The apparatus of claim 22, wherein the formal model defines a Mealy machine.

24. The apparatus of claim 22, wherein the circuit design is set out in Verilog.

25. The apparatus of claim 22, wherein the circuit design is set out in VHDL.

26. The apparatus of claim 22, wherein the set of synchronization points is closed such that a simulation run between different points of the set of synchronization points occurs in a finite number of steps.

27. The apparatus of claim 17, wherein the simulation of the circuit design captures simulation state at synchronization points having identical contents of all variables of the control state, and fails to capture simulation state at other points.

28. The apparatus of claim 22, wherein the simulation of the circuit design captures simulation state at synchronization points having identical contents of all variables of the control state, and fails to capture simulation state at other points.

29. The apparatus of claim 22, further comprising:
computing state transitions between a number of the synchronization points.

30. The apparatus of claim 17, further comprising:
computing state transitions between a number of the synchronization points.

31. The apparatus of claim 17, wherein the simulation of the circuit design captures simulation state at synchronization points having identical contents of all variables of the control state.

32. The apparatus of claim 22, wherein the simulation of the circuit design captures simulation state at synchronization points having identical contents of all variables of the control state.

33. A non-transitory computer readable medium with electronic design automation tool instructions, comprising:
computer executable instructions performing:
providing a circuit design in the form of a hardware description language;
performing a simulation of the circuit design by setting out, for multiple points of time during execution of the circuit design, a control state of the circuit design and a program state of the circuit design, wherein the control state includes program counters and pending variable updates, including:
    assigning a symbol to each signal of the circuit design; and
    executing a symbolic simulation of the circuit design including at least one non-unrollable loop;
based on the simulation of the circuit design in the form of the hardware description language, identifying and capturing at synchronization points where contents of the control state are identical:
    a combinational logic expression of the simulation output; and
    next state functions of the simulation; and
based on said identifying and capturing, generating a formal model of the circuit design,
    wherein the simulation of the circuit design identifies the synchronization points in time based on having identical contents of at least one variable of the control state.

34. The medium of claim 33, wherein the formal model defines a Mealy machine.

35. The medium of claim 33, wherein the circuit design is set out in Verilog.

36. The medium of claim 33, wherein the circuit design is set out in VHDL.

37. The medium of claim 33, wherein the set of synchronization points is closed such that a simulation run between different points of the set of synchronization points occurs in a finite number of steps.

38. A non-transitory computer readable medium with electronic design automation tool instructions, comprising:
    computer executable instructions performing:
        providing a circuit design in the form of a hardware description language;
        performing a simulation of the circuit design by setting out, for multiple points of time during execution of the circuit design, a control state of the circuit design and a program state of the circuit design, wherein the control state includes program counters and pending variable updates, including:
            assigning a symbol to each signal of the circuit design; and
            executing a symbolic simulation of the circuit design including at least one time delay;
        based on the simulation of the circuit design in the form of the hardware description language, identifying and capturing at synchronization points where contents of the control state are identical:
            a combinational logic expression of the simulation output; and
            next state functions of the simulation; and
        based on said identifying and capturing, generating a formal model of the circuit design,
        wherein the simulation of the circuit design identifies the synchronization points in time based on having identical contents of at least one variable of the control state.

39. The medium of claim 38, wherein the formal model defines a Mealy machine.

40. The medium of claim 38, wherein the circuit design is set out in Verilog.

41. The medium of claim 38, wherein the circuit design is set out in VHDL.

42. The medium of claim 38, wherein the set of synchronization points is closed such that a simulation run between different points of the set of synchronization points occurs in a finite number of steps.

43. The medium of claim 33, wherein the simulation of the circuit design captures simulation state at synchronization points having identical contents of all variables of the control state, and fails to capture simulation state at other points.

44. The medium of claim 38, wherein the simulation of the circuit design captures simulation state at synchronization points having identical contents of all variables of the control state, and fails to capture simulation state at other points.

45. The medium of claim 38, further comprising:
    computing state transitions between a number of the synchronization points.

46. The medium of claim 33, further comprising:
    computing state transitions between a number of the synchronization points.

47. The medium of claim 33, wherein the simulation of the circuit design captures simulation state at synchronization points having identical contents of all variables of the control state.

48. The medium of claim 38, wherein the simulation of the circuit design captures simulation state at synchronization points having identical contents of all variables of the control state.

* * * * *

UNITED STATES PATENT AND TRADEMARK OFFICE
CERTIFICATE OF CORRECTION

| | | Page 1 of 1 |
|---|---|---|
| PATENT NO. | : 8,306,802 B2 | |
| APPLICATION NO. | : 11/556050 | |
| DATED | : November 6, 2012 | |
| INVENTOR(S) | : Zhu et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 973 days.

Signed and Sealed this
Twenty-eighth Day of October, 2014

Michelle K. Lee
*Deputy Director of the United States Patent and Trademark Office*